United States Patent [19]

Schneider et al.

[11] Patent Number: 5,351,256
[45] Date of Patent: Sep. 27, 1994

[54] ELECTRICALLY INJECTED VISIBLE VERTICAL CAVITY SURFACE EMITTING LASER DIODES

[75] Inventors: Richard P. Schneider; James A. Lott, both of Albuquerque, N. Mex.

[73] Assignee: The United States of America as represented by the United States Department of Energy, Washington, D.C.

[21] Appl. No.: 55,178

[22] Filed: Apr. 28, 1993

[51] Int. Cl.[5] .................................. H01S 3/19
[52] U.S. Cl. ........................ 372/45; 372/96; 372/99
[58] Field of Search .............. 372/45, 46, 96, 98, 372/102, 99, 50

[56] References Cited

U.S. PATENT DOCUMENTS

| | | | |
|---|---|---|---|
| 4,949,350 | 8/1990 | Jewell et al. | 372/45 |
| 5,018,157 | 5/1991 | Deppe et al. | 372/45 |
| 5,245,622 | 9/1993 | Jewell et al. | 372/45 |
| 5,258,990 | 11/1993 | Olbright et al. | 372/46 X |

Primary Examiner—John D. Lee
Assistant Examiner—Robert McNutt
Attorney, Agent, or Firm—Gregory A. Cone

[57] ABSTRACT

Visible laser light output from an electrically injected vertical cavity surface emitting laser (VSCEL) diode is enabled by the addition of phase-matching spacer layers on either side of the active region to form the optical cavity. The spacer layers comprise InAlP which act as charge carrier confinement means. Distributed Bragg reflector layers are formed on either side of the optical cavity to act as mirrors.

24 Claims, 4 Drawing Sheets

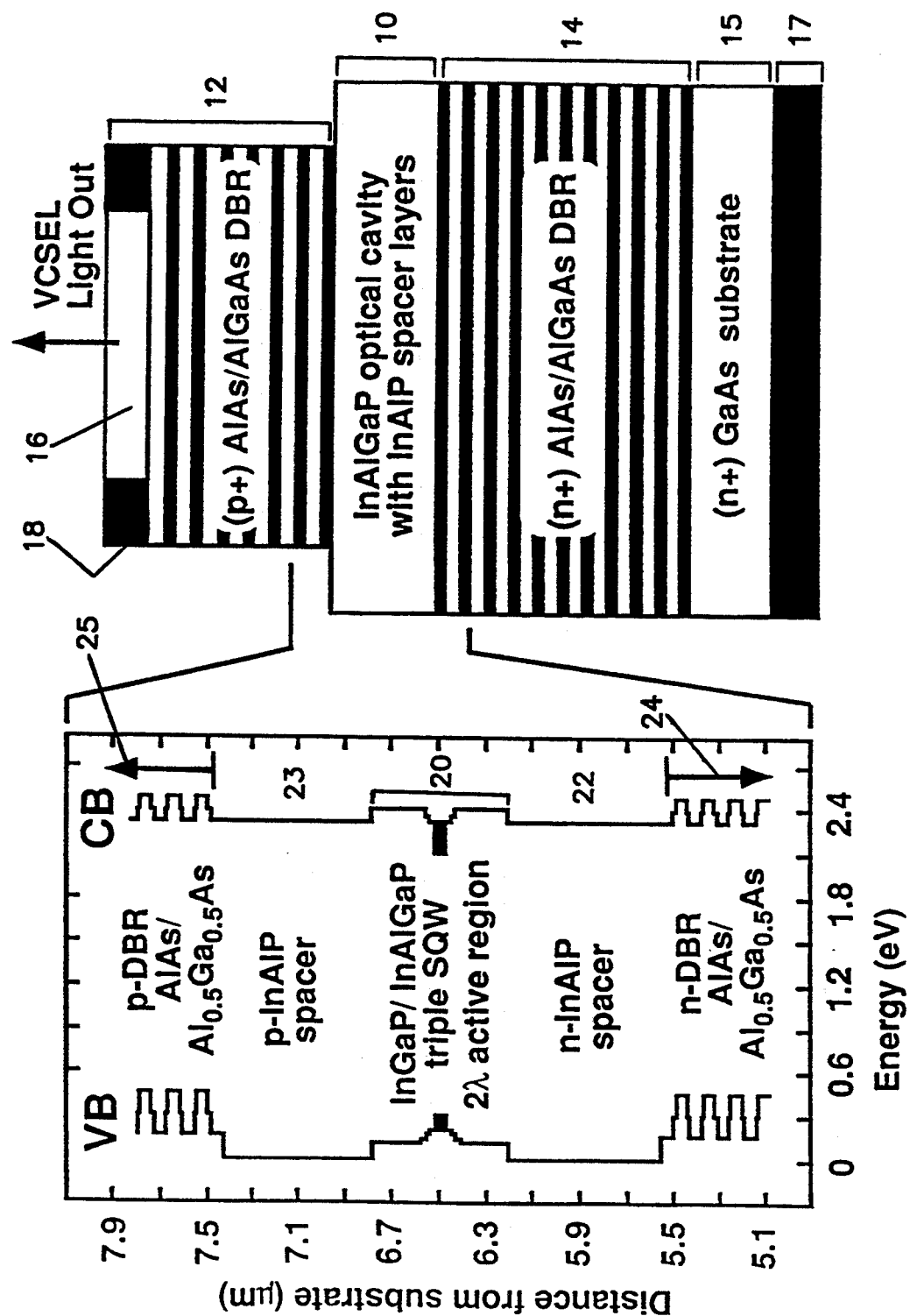

ELECTRICALLY INJECTED VISIBLE VERTICAL CAVITY SURFACE EMITTING LASER DIODES

The government has rights in this invention pursuant to Contract No. DE-AC04-76DP00789 awarded by the Department of Energy.

BACKGROUND OF THE INVENTION

This invention relates to laser diodes. More particularly, this invention relates to vertical cavity surface emitting laser diodes that are electrically injected and emit in the visible region of the spectrum.

Vertical cavity surface emitting laser (VCSEL) diodes are very useful structures that can replace LED's and HeNe lasers (at visible wavelengths) in a variety of applications. Most of the development has been in the GaAs/AlGaAs system and has been limited to infrared and deep red wavelengths. The shortest wavelength achieved has been 699 nm with this system. It would be very desirable to have a VCSEL that would provide useful output in the rest of the visible spectrum. A red emitting VSCEL structure has been reported by using the InGaP/InAlGaP system as a strained quantum well (SQW) active region, R. P. Schneider, R. P. Bryan, J. A. Lott, and G. R. Olbright, "Visible (657 nm) InGaP-/InAlGaP strained quantum well vertical-cavity surface-emitting laser," Applied Physics Letters, Vol 60, No 15, Apr. 13, 1992. However, this device was optically pumped, and an electrically injected device is still an unmet need.

SUMMARY OF THE INVENTION

VCSEL diodes are normally formed on a semiconductor substrate and configured with lower and upper distributed Bragg reflector (DBR) stacks acting as the end mirrors for an active region having spacer layers and a central strained quantum well region. This central region can also be an unstrained quantum well or even a bulk active region. The spacer layers and the central region form a Fabry-Perot cavity with a total thickness equal to an integer multiple of $\lambda/2n$, where $\lambda$ is the wavelength of light and n is the refractive index of the medium at the wavelength $\lambda$. The laser light output can be directed out of either the top or the bottom as determined by which DBR stack has higher reflectivity. The lower electrode is normally on the bottom of the substrate, and the upper electrode is located at a level somewhere above the active region. Often the upper electrode is a pad on top of the VCSEL structure into which is etched a hole for light transmission. The VCSEL is normally a mesa structure that is created by etching down from around the upper electrode level to the level of the bottom of the upper DBR stack (the upper electrode could also be at this level, surrounding the vertical structure formed by the etch), to the base of the active region, or occasionally farther down towards the base of the lower DBR stack. The vertical cavity can also be isolated by ion implantation around the perimeter of an individual structure. This may remove the need to etch down into the layers of the structure. A general description of VSCEL diodes can be found in a reference by J. L. Jewell et al., "Vertical-Cavity Surface-Emitting Lasers: Design, Growth, Fabrication, Characterization," IEEE Journal of Quantum Electronics, Vol. 27, No. 6, June 1991.

The electrically injected VCSEL diode of this invention is operable chiefly because of a new cavity design. The structure starts with conventional elements of an InGaP/InAlGaP strained quantum well active cavity and AlAs/Al$_{0.5}$Ga$_{0.5}$As DBR's. The advance is in the addition of relatively thick InAlP optical phase-matching spacer layers on either side of the SQW region to fill out the remainder of the multiple $\lambda/2$ thickness of the Fabry-Perot cavity. This and several other improvements result in the first VCSEL diode able to emit in the visible spectrum.

DESCRIPTION OF THE DRAWINGS

FIG. 1 is a diagrammic cross sectional view of the VCSEL diode.

FIG. 2 is a real-space energy band diagram of the active regions of the VCSEL diode of FIG. 1 further including several pairs of DBRs on either side of the active region.

DETAILED DESCRIPTION OF THE INVENTION

Figure 3:
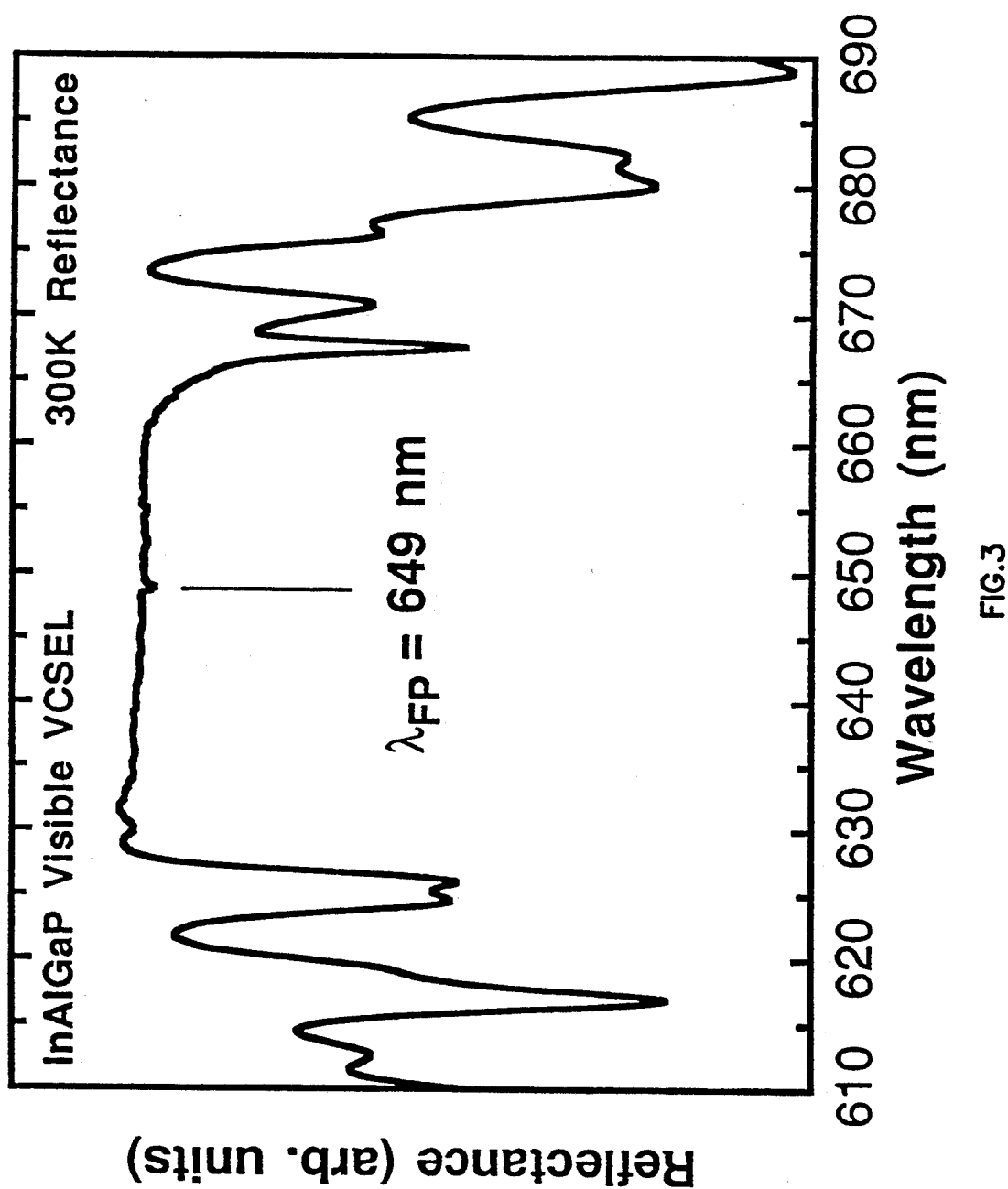
FIG. 3 is a graph of the reflectance spectrum for the MOVPE-grown VCSEL wafer.

The inventors herein in conjunction with others have previously developed optically pumped InGaP/InAlGaP SQW VCSELs employing AlAs/Al$_{0.5}$Ga$_{0.5}$As DBR's at red wavelengths. Development of electrically-injected visible VCSELs employing InAlGaP-based active region material has been complicated by several critical materials and device design issues. The bandgap in the In$_{0.5}$(Al$_{0.7}$Ga$_{0.3}$)$_{0.5}$P confining layers ($\cong$2.31–2.34 eV) commonly used is the InGaP/InAlGaP SQW active region is significantly larger than those in either of the DBR layers [E$_G$(AlAs)$\cong$2.17 eV, E$_G$(Al$_{0.5}$Ga$_{0.5}$As)$\cong$2.04 eV], complicating efficient carrier injection into the active region because of reduced charge carrier confinement and increased carrier leakage. This bandgap difference is an extreme variation from normal practice in laser diode design. This "total confinement" value (the energy difference between the bandgap of the active quantum well layers and the average bandgap of the cladding/DBR) in typical IR edge-emitting laser diodes is 650–900 meV, in IR (850 and 980 nm) VSCELs it is about 600 meV, and in AlGaInP visible edge-emitting laser diodes it is about 400–500 meV. In contrast, the "total confinement" for the devices of this invention is about 200–250 meV. This aggravates the carrier confinement deficiencies for the VSCEL structure noted above.

In addition, InAlGaP-based visible (edge-emitting) laser diodes generally suffer from poor temperature characteristics and high threshold current densities relative to GaAs/AlGaAs lasers due to reduced confinement potentials, increased carrier leakage currents, much lower characteristic temperature T$_0$ (the lower the T$_0$, the more the temperature sensitivity of the device), and higher thermal resistivity. Compounding these issues, VCSELs are subject to significant heating due to high resistance associated with charge carrier transport in the DBRs and high current densities in the gain region. This background indicates that achieving visible output from an electrically injected VSCEL diode is a very difficult task.

To overcome these obstacles, study was begun into the optical cavity design for the VSCEL structure by first characterizing edge-emitting laser diodes with AlGaAs DBR cladding layers that simulate the injection conditions present in a VSCEL. By optimizing carrier injection efficiency through the addition of InAlP phase-matching spacer layers, room temperature electrically-injected lasing was achieved in InAlGaP-based visible VCSEL diodes over the wavelength range 639–661 nm. The InAlGaP system emits light over the range 720–550 nm, covering the deep red to green range of the visible spectrum, and the scope of this invention should not be limited to a specific wavelength.

These devices were grown using low-pressure metal-organic vapor-phase epitaxy (MOVPE) techniques as reported by the inventors and others in R. P. Schneider, Jr., R. P. Bryan, J. A. Lott and E. D. Jones, "MOVPE growth of InAlGaP-based visible vertical-cavity surface emitting lasers", J. Cryst. Growth 124, 763 (1992). This reference is incorporated by reference in its entirety.

It should be appreciated that the following specific description is for the first, non-optimized devices to produce the electrically injected laser output at a visible wavelength. Further refinements to the processing sequence are underway and will result in better devices. The invention should not be considered as limited by this specific example. The true scope of the invention is to be found in the claims.

The following description refers to FIG. 1. The DBRs 12 and 14 are composed of alternating quarter wave ($\lambda/4$) layers of AlAs and $Al_{0.5}Ga_{0.5}As$, with 10 nm-thick $Al_{0.75}Ga_{0.25}As$ barrier-reduction layers inserted between to improve carrier transport. The convention for this quarter wave thickness is actually $\lambda/4n$, where $\lambda$ is the wavelength of the light measured in a vacuum and n is the refractive index of the material at that wavelength. The (p) DBR 12 is doped to $4 \times 10^{18}$ cm$^{-3}$ using C, while the (p+)GaAs cap is doped to $6-8 \times 10^{19}$ cm$^{-3}$. The (p) InAlP, 23 in FIG. 2, is doped to $6-8 \times 10^{17}$ cm$^{-3}$ using Mg, while the bottom (n) DBR 14 and (n) InAlP, 22 in FIG. 2, are doped to $2 \times 10^{18}$ cm$^{-3}$ using Si. Those skilled in the art will realize that other material combinations such as InAlP/InAlGaP and dielectrics such as $Nb_2O_5/SiO_2$, $ZnSe/CaF_2$, or $SiO_2/ZrO_2$ could be used as the DBR layers. As a specific example, the DBRs could be composed of $InAlP/In(Al_yGa_{1-y})P$ where y is approximately 0.2 and doped with Mg ($6-8 \times 10^{17}$) and Si ($2 \times 10^{18}$).

Gain-guided broad-area ($50 \times 250$–1000 $\mu$m) edge-emitting laser diodes were fabricated with a patterned Ti/Au p-contact metallization and a full back surface GeAu/Ni/Au n-contact metallization. The p-metal stripe was used as an etch mask, and the AlGaAs DBR cladding was removed by a wet etchant. This improves current injection and optical confinement. The cleaved facets were uncoated, and the devices were tested without heat-sinking on a probe stage.

The non-optimized visible VCSEL test devices were fabricated by etching away the p-DBR to the top of the optical cavity using a $BCl_3$ plasma etch. An annular p-metal contact defines aperture sizes of 10–20 $\mu$m, shown as 16 in FIG. 1, with a 5 $\mu$m-wide contact ring, 18.

FIG. 2 shows the calculated charge-neutral real-space energy band diagram for the active region 20, $In_{0.5}Al_{0.5}P$ spacer layers, 22 and 23, and several DBR pairs, 24 and 25. The diagram for the left side energy levels labelled VB is for the valence band, while the right side diagram labelled CB is for the conduction band. The active region 20 is $2\lambda$ thick. The precise thickness will vary with wavelength: about 390 nm at $\lambda = 650$ nm and about 400 nm at $\lambda = 670$ nm. It is composed of 10 nm thick $In_{0.56}Ga_{0.44}P$ strained quantum wells surrounded by lattice-matched $In_{0.5}(Al_yGa_{1-y})_{0.5}P$ barriers, step-graded from y=0.4 to y=0.7 in a separate-confinement heterostructure (SCH). For the edge-emitting lasers, only a single SQW was used, while for the VCSELs 3 SQWs were employed, separated by 10 nm thick $In_{0.5}(Al_{0.4}Ga_{0.6})_{0.5}P$ barriers. The remainder of the $2\lambda$ active region is $In_{0.5}(Al_{0.7}Ga_{0.5})_{0.5}P$, terminating on the $In_{0.5}Al_{0.5}P$ spacer layers 22 and 23.

The inventors have fabricated broad-area gain-guided edge-emitting visible laser diodes incorporating $2\lambda$ active regions with 1 $\mu$m-thick $In_{0.5}Al_{0.5}P$ cladding and measured pulsed, room-temperature threshold current densities of $J_{TH} \approx 170$–400 A/cm$^2$ with differential quantum efficiencies of $\eta = 0.3$–0.4 per facet at wavelengths of $\lambda = 660$–670 nm. These values are among the best reported for this wavelength range, offering assurance of high quality material and heterostructure design.

However, current injection for VCSELs is through the $AlAs/Al_{0.5}Ga_{0.5}As$ DBRs and across the AlGaAs/InAlGaP interfaces. Efforts at achieving electrically-injected lasing in VCSEL diode structures employing the $2\lambda$ active region described above, sandwiched between $AlAs/Al_{0.5}Ga_{0.5}As$ DBRs, without the $In_{0.5}Al_{0.5}P$ spacer layers 22, have been unsuccessful to date.

To improve injection into the VCSEL active region, the inventors first fabricated edge-emitting laser diodes, with cladding composed of $AlAs/Al_{0.5}Ga_{0.5}As$ DBRs identical to those used in the VCSELs, and $In_{0.5}Al_{0.5}P$ spacers inserted between the cladding and the $2\lambda$ active region. Several devices were grown with increasing $In_{0.5}Al_{0.5}P$ spacer thickness, as shown in Table 1 below.

TABLE 1

| InAlP spacer thickness | # of DBR pairs in p-clad | $J_{TH}$ (A/cm$^2$) |
|---|---|---|
| 1$\lambda$(210 nm) | 8 | 1140 |
| 2$\lambda$(420 nm) | 8 | 640 |
| 3$\lambda$(630 nm) | 8 | 470 |
| 3$\lambda$(630) | 36 | 480 |
| 1 $\mu$m | 0 | 330 |

In Table 1 the threshold current density is observed to decrease markedly with increasing $In_{0.5}Al_{0.5}P$ spacer thickness, to $\approx 460$ A/cm$^2$ for the device with 3$\lambda$ of $In_{0.5}Al_{0.5}P$ spacer on each side of the cavity. Other thicknesses could be used, but the thickness of the phase matching spacer layers must be some multiple of $\lambda/4$, and the total thickness of the cavity must be a multiple of $\lambda/2$.

Because the average refractive index of the $AlAs/Al_{0.5}Ga_{0.5}As$ DBRs ($\approx 3.29$ at $\lambda = 670$ nm) is similar to the refractive index of the InAlP spacer layers (about 3.32 at $\lambda = 670$ nm), the dramatic improvement in the performance of the edge-emitting lasers with increasing $In_{0.5}Al_{0.5}P$ cladding thickness cannot be attributed solely to improved optical confinement. Instead, the reduction in lasing threshold seems to be due to improved carrier injection efficiency.

Indeed, the average bandgap of the $AlAs/Al_{0.5}Ga_{0.5}As$ DBR cladding is $\approx 0.23$ eV smaller than that of the $In_{0.5}Al_{0.5}P$. By displacing these lower-bandgap regions from the active region of the device, their influence on carrier leakage is reduced. The use of p-In$_{0.5}$Al$_{0.5}$P cladding is expected to lead to reduced electron leakage current in visible edge-emitting laser diodes by offering increased electron confinement, and excellent results have been obtained with this approach. In addition, recent photoluminescence excitation (PLE) spectroscopy studies of InGaP/InAlGaP lattice-matched and strained quantum wells have suggested a relatively small valence band offset, and calculations based on these results indicate that hole leakage may be comparable to electron leakage in InAlGaP heterostructures. Thus the improved hole confinement afforded by the InAlP shown in FIG. 2 may also play a critical role.

In addition, the relatively thick spacer provides a region in which the high energy ("hot") injected carriers may thermalize to lower energy. This should reduce leakage in the form of carrier overshoot. Reduction in carrier leakage currents should in turn lead to increased characteristic temperature T$_0$, which is particularly critical to VCSELs because of the tendency for heating in the very small gain region. Finally, it should be noted that there may be some advantage in moving the cavity-DBR interfaces further from the active region. This is because the transition from As to P in the MOVPE process is a difficult one, with uncertain heterointerface characteristics. Other materials are candidates for the spacer layers. For example, pure AlAs could be used. Although its bandgap is lower than InAlP, its thermal properties are better.

Visible vertical-cavity surface-emitting lasers were grown with the extended cavity described above, as shown in FIGS. 1 and 2. Referring to FIG. 2, the active region 20 is 2λ thick, and the thickness of the In$_{0.5}$Al$_{0.5}$P optical phase-matching spacer layers 22 is 3λ on each side, for a total optical cavity thickness of 8λ shown as 10 in FIG. 1. The bottom high-reflectivity Si-doped n-DBR is composed of 55½ pairs, 24 in FIG. 2 and 14 in FIG. 1, while the lower-reflectivity output coupler consists of an identical 36-pair C-doped p-DBR, 25 in FIG. 2 and 12 in FIG. 1. A top (n+) GaAs layer is used to improve the ohmic contact to the top electrode. The same doping values that were used in the edge-emitting laser study were used for the VSCELs.

The measured reflectance spectra for the structure is shown in FIG. 3. A Fabry-Perot resonance is observed in the center of the mirror bandpass, at λ=649nm. The wafers were grown without rotation, so there is a nearly linear grade in the layer thicknesses of about 7%, from front (thickest) to back (thinnest). This thickness variation corresponds directly to a variation in the wavelength position of the DBR and the Fabry-Perot resonance, while the wavelength of the quantum well transition changes little (about 7.5 nm) over the same region. Devices were tested over the wavelength range 630–680 nm. Electrically-injected lasing was achieved over the wavelength range 635–663 nm, with peak pulsed power output of 3.4 mW at 650 nm measured on devices with 20 μm diameter emitting apertures, 16 in FIG. 1. Possible output wavelengths using these particular materials should range from about 560 nm to about 720 nm. Lasing threshold current at this wavelength was 30 mA, with a voltage at threshold of 2.7 V. The resistance measured for the devices is in the range of 14–19 Ω depending on the device size.

Figure 4:
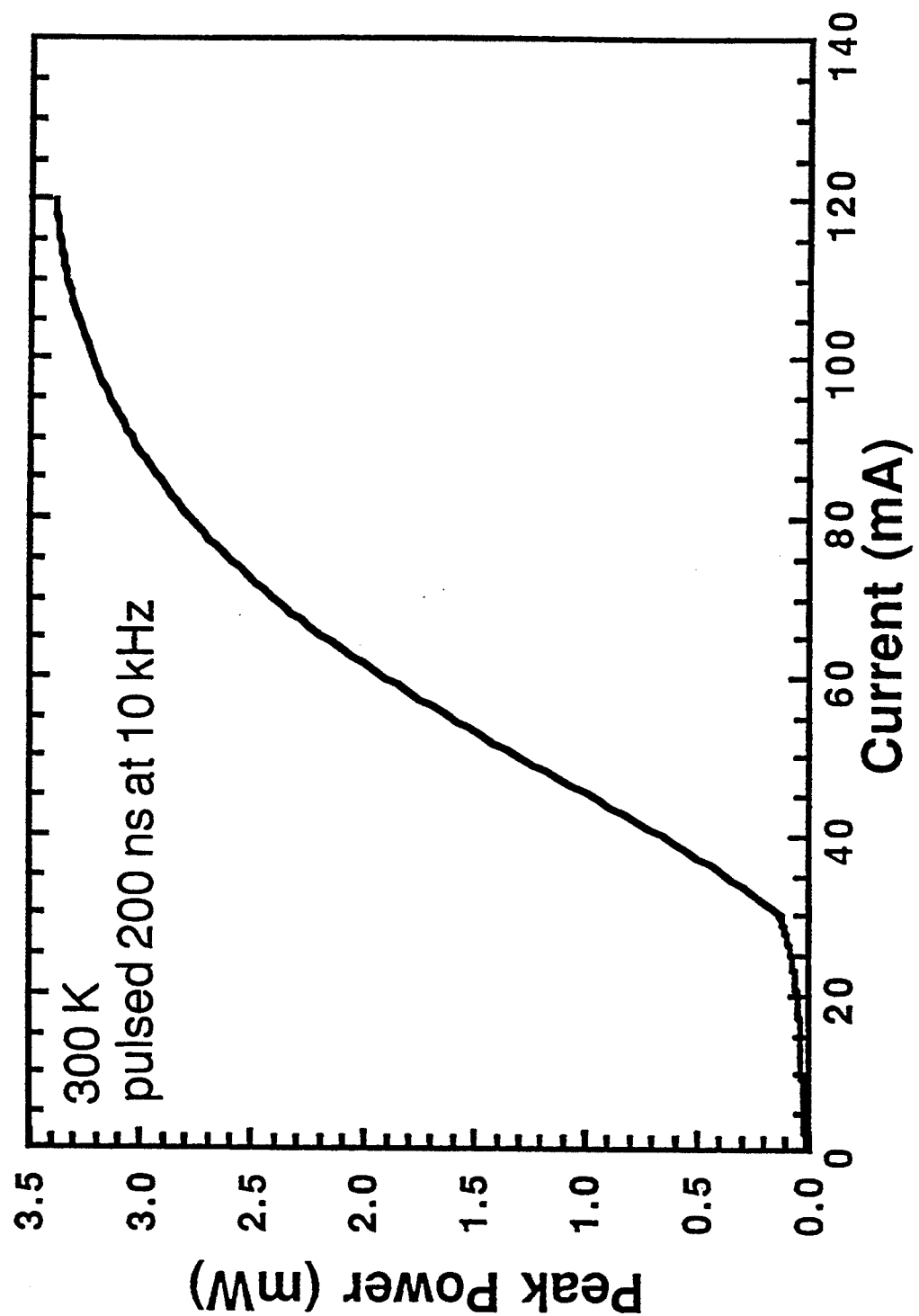
FIG. 4 is a light (optical power) versus current plot for the VCSEL diode.
Figure 5:
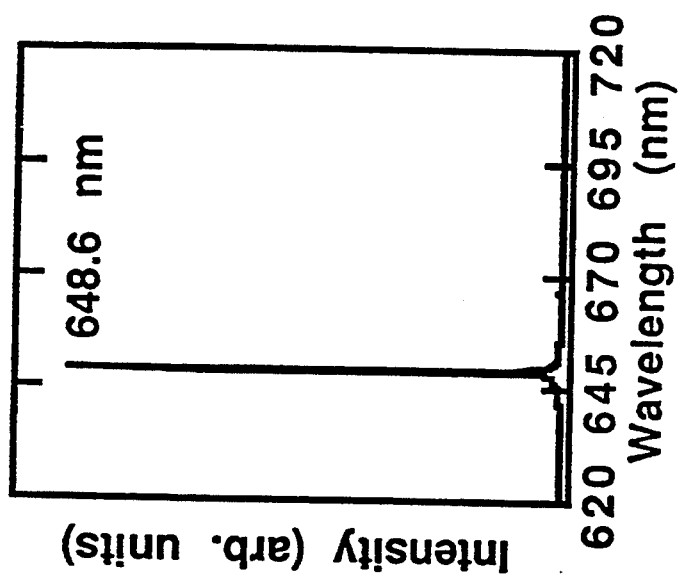
FIG. 5 is a graph of the lasing spectrum for the VCSEL diode.

The low device resistance is attributed to small energy band offsets, high DBR doping, and the large number of DBR pairs. Many devices continue to lase with a duty cycle of 40% at a repetition rate of 1 MHz. A lasing spectrum is shown in FIG. 5, along with a light-current (L-I) characteristic, given in FIG. 4. The short lasing wavelength is consistent with an n=2 lasing transition (n≈650 nm) rather than n=1 (80 ≈670 nm). Population of the n=2 subband is probably enhanced due to heating in the active region, though further work is necessary to confirm this hypothesis. Cavity losses increase the gain threshold, and contributions at the n=2 quantum well transistion are required for lasing.

Substantial improvements in device performance are anticipated with more sophisticated process development. The as-fabricated devices could be improved for better lateral current confinement by having a deeper etch past the top DBR layers into and through the optical cavity or by using ion implantation for current confinement. The region at the interface between the top of the optical cavity and the base of the upper DBR stack would be implanted except for a central region directly below and extending radially outward 1–5 μm from the aperture in the top electrode so as to channel and concentrate the charge carriers from the upper electrode into this central region for increased efficiency. The present structure has more heating and current spreading than a more optimized structure would have.

We claim:

1. An electrically injected vertical cavity laser diode for emitting light at a visible wavelength comprising:
   a III–V compound substrate of a first conductivity type connected to a first electrode;
   a first multiplicity of distributed Bragg reflectors (DBRs) being of the first conductivity type formed above the substrate;
   an optical cavity formed above the first DBRs and comprising a first optical phase matching spacer layer located adjacent the first DBRs and of the same conductivity, an active region having an active lasing means located adjacent to and above the first spacer layer, and a second optical phase matching spacer layer adjacent to and above the active region and of the opposite conductivity type from the first spacer layer, wherein each spacer layer has a thickness of between one wavelength and three wavelengths of the emitted light;
   a second multiplicity of distributed Bragg reflectors (DBRs) of the opposite conductivity type formed above the optical cavity; and
   a second electrode means located above the active region.

2. The laser of claim 1 wherein the optical phase-matching layers have higher bandgaps than the materials comprising the active lasing means.

3. The laser of claim 1 wherein the optical phase-matching layers comprise materials which optimize charge carrier injection efficiency into the active region.

4. The laser of claim 1 wherein the optical phase-matching layers comprise AlInP.

5. The laser of claim 1 wherein the active lasing means comprises at least one quantum well.

6. The laser of claim 5 wherein the active lasing means comprises at least one strained quantum well.

7. The laser of claim 6 wherein the active lasing means further comprises lattice-matched barrier means on either side of the at least one strained quantum well.

8. The laser of claim 7 wherein various components of the active lasing means comprise InAlGaP compounds.

9. The laser of claim 8 wherein the composition of the InAlGaP compounds is defined as $In_x(Al_yGa_{1-y})_{1-x}P$, where $0 \leq y \leq 1$.

10. The laser of claim 1 wherein the active lasing means comprises a bulk semiconductor material.

11. An electrically injected vertical cavity laser diode for emitting light at a visible wavelength comprising:
a III-V compound substrate of a first conductivity type connected to a first electrode;
a first multiplicity of distributed Bragg reflectors (DBRs) being of the first conductivity type formed above the substrate;
an optical cavity formed above the first DBRs and comprising an active region having at least one strained quantum well surrounded by lattice-matched barrier means, a first optical phase matching spacer layer located adjacent the first DBRs and of the same conductivity, and a second optical phase matching spacer layer on the other side of the active region and of the opposite conductivity type, wherein each spacer layer has a thickness of between one wavelength and three wavelengths of the emitted light and the optical phase matching layers have higher bandgaps than the materials comprising the DBR's;
a second multiplicity of distributed Bragg reflectors (DBRs) of the opposite conductivity type formed above the optical cavity; and
a second electrode means, such that the second electrode means has an opening within it for the transmission of the laser light output.

12. The laser of claim 11 wherein the optical phase-matching layers have higher bandgaps than the materials comprising the at least one strained quantum well and the surrounding lattice-matched barrier means.

13. The laser of claim 11 wherein the optical phased-matching layers comprise AlInP.

14. The laser of claim 11 wherein the active region is at least one wavelength thick.

15. The laser of claim 11 wherein various components of the at least one strained quantum well and the surrounding lattice-matched barrier means comprise InAlGaP compounds.

16. The laser of claim 15 wherein the composition of the InAlGaP compounds is defined as $In_x(Al_yGa_{1-y})_{1-x}P$, wherein $0 \leq y \leq 1$.

17. An electrically injected vertical cavity laser diode for emitting light at a visible wavelength comprising:
a III-V compound substrate of a first conductivity type connected to a first electrode;
a first multiplicity of distributed Bragg reflectors (DBRs) being of the first conductivity type formed above the substrate;
an optical cavity formed above the first DBRs and comprising a first optical phase matching spacer layer located adjacent the first DBRs and of the same conductivity, an active region having an active lasing means located adjacent to and above the first spacer layer, and a second optical phase matching spacer layer adjacent to and above the active region and of the opposite conductivity type form the first spacer layer, wherein each spacer layer is an integral multiple of $\lambda/4n$ in thickness where $\lambda$ is the wavelength and n is the refractive index of the spacer and the total thickness of the optical cavity is an integral multiple of $\lambda/2n$;
a second multiplicity of distributed Bragg reflectors (DBRs) of the opposite conductivity type formed above the optical cavity; and
a second electrode means located above the active region.

18. The laser of claim 17 wherein the optical phase-matching layers have higher bandgaps than the materials comprising the active lasing means.

19. The laser of claim 17 wherein the optical phase-matching layers comprise AlInP.

20. The laser of claim 17 wherein the active lasing means comprises at least one quantum well.

21. The laser of claim 17 wherein the active lasing means comprises at least one strained quantum well.

22. The laser of claim 17 wherein various components of the active lasing means comprise InAlGaP compounds.

23. The laser of claim 22 wherein the composition of the InAlGaP compounds is defined as $In_x(Al_yGa_{1-y})_{1-x}P$, where $0 \leq y \leq 1$.

24. The laser of claim 17 wherein the active lasing means comprises a bulk semiconductor material.

* * * * *